United States Patent [19]
Yoshii et al.

[11] Patent Number: 5,610,715
[45] Date of Patent: Mar. 11, 1997

[54] DISPLACEMENT DETECTING SYSTEM, AN EXPOSE APPARATUS, AND A DEVICE MANUFACTURING METHOD EMPLOYING A SCALE WHOSE DISPLACEMENT IS DETECTED BY A SELECTED DETECTION HEAD

[75] Inventors: Minoru Yoshii, Tokyo; Kyoichi Miyazaki; Seiji Takeuchi, both of Utsunomiya, all of Japan

[73] Assignee: Canon Kabushiki Kaisha, Tokyo, Japan

[21] Appl. No.: 412,309

[22] Filed: Mar. 29, 1995

[30] Foreign Application Priority Data

Mar. 30, 1994 [JP] Japan ............................ 6-060662

[51] Int. Cl.⁶ .............................................. G01B 9/02
[52] U.S. Cl. .................................................. 356/356
[58] Field of Search ........................ 356/356, 358, 356/363

[56] References Cited

U.S. PATENT DOCUMENTS

| | | | |
|---|---|---|---|
| 5,182,610 | 1/1993 | Shibata | 356/356 |
| 5,200,800 | 4/1993 | Suda et al. | 356/401 |
| 5,291,023 | 3/1994 | Hasegawa et al. | |
| 5,333,050 | 7/1994 | Nose et al. | 356/356 |
| 5,369,486 | 11/1994 | Matsumoto et al. | 356/356 |

FOREIGN PATENT DOCUMENTS 5-215515  8/1993  Japan.

*Primary Examiner*—Samuel A. Turner
*Assistant Examiner*—Amanda Merlino
*Attorney, Agent, or Firm*—Fitzpatrick, Cella, Harper & Scinto

[57] ABSTRACT

A displacement detecting system includes a scale provided on a surface of a movable object and having a diffraction grating formed along a predetermined direction, a head unit disposed above the surface of the movable object and having a plurality of detection heads, for detecting displacement of the scale in the predetermined direction, the detection heads being disposed along a direction different from the predetermined direction, and a selecting device for selecting at least one detection head out of the detection heads, for detection of a displacement of the scale in the predetermined direction.

7 Claims, 13 Drawing Sheets

DISPLACEMENT DETECTING SYSTEM, AN EXPOSE APPARATUS, AND A DEVICE MANUFACTURING METHOD EMPLOYING A SCALE WHOSE DISPLACEMENT IS DETECTED BY A SELECTED DETECTION HEAD

FIELD OF THE INVENTION AND RELATED ART

This invention relates to a displacement detecting system for detecting the amount of displacement of a movable member along a two-dimensional plane. According to another aspect; the invention is concerned with an exposure apparatus having such displacement detecting system, and with a device manufacturing method which uses such exposure apparatus.

The manufacture of semiconductor devices such as ICs or liquid crystal displays includes a process of transferring a circuit pattern formed on an original, such as a reticle or photomask, onto a resist coated wafer by means of a semiconductor exposure apparatus.

As such exposure apparatus, step-and-repeat type exposure apparatuses or step-and-scan type exposure apparatuses having a printing chip size as $\sqrt{2}$ times larger, are well known.

FIG. 1 is a schematic side view of a known type step-and-repeat semiconductor exposure apparatus. As illustrated in FIG. 1, the apparatus comprises a moving mechanism having an X stage 1007 and a Y stage 1006. The moving mechanism is provided with a mirror support 1021 for supporting a measurement light path mirror 1023, to be described below. The mirror supporting member 1021 supports a bearing means 1010 through a tilt mechanism 1008. Mounted on the bearing means 1010 is a wafer chuck 1005 for holding a wafer 1004 on its top surface. The wafer chuck 1005 is supported movably along a Z axis, through a fine Z motion mechanism 1009. Thus, the wafer chuck 1005 is movable along the X and Y directions, and also its position with respect to the Z direction as well as its tilt with respect to the X-Y plane can be adjusted minutely.

Disposed above the wafer chuck 1005 are an original 1003 having a circuit pattern formed thereon placed opposed to the wafer 1004, a light source 1001 for projecting the circuit pattern of the original 1003 onto the wafer 1004, and a barrel 1002 having a reduction projection optical system, for projecting an optical image, formed by the passage of light from the light source 1001 through the original 1003, onto the wafer 1004 in a reduced scale.

Laser distance measuring device 1020 is a component of a displacement detecting system for detecting the relative positional relationship between the mirror support 1021 and the barrel 1002 along the X-Y plane. The laser distance measuring device 1020 includes a measurement light path mirror 1023 supported by the mirror support 1021, a laser light source 1022 for projecting laser light to the measurement light path mirror 1023, a reference light path mirror 1024 mounted on the barrel 1022, a half mirror 1025 for dividing the laser light from the laser light source 1022 into measurement light and reference light, and a light path vending mirror for deflecting the reference light divided by the half mirror 1025 toward the reference light path mirror 1024.

The laser light projected by the laser light source 1022 is divided by the half mirror 1025 into the reference light and the measurement light, which are then reflected by the reference light path mirror 1024 and the measurement light path mirror 1023, respectively, back to the laser light source 1022. By comparing the phases of these lights, the position of the mirror support 1021 relative to the barrel 1022 is detected.

For performing the exposure process, first a wafer 1004 coated with a resist is fixed to the wafer chuck 1005, and, by means of the tilt mechanism 1008 and/or the fine Z motion mechanism 1009, the inclination of the wafer surface and/or the position thereof with respect to the Z direction is adjusted. Then, the light source 1001 is turned on such that the circuit pattern as a whole of the original 1003 is projected at once in a reduced scale onto the wafer 1004, whereby the circuit pattern is printed on the wafer. Subsequently, the X stage 1007 and the Y stage 1006 are moved stepwise by a predetermined distance to move and change the exposure region, while measuring the position of the mirror support 1021 through the laser distance measuring device 1022. Then, the light source 1001 is turned on again, and the exposure operation is performed again. This process is repeated, and finally, circuit patterns are printed on the whole surface of the wafer 1004.

As compared therewith, the step-and-scan process is a process in which one circuit pattern is divided into plural blocks which are scanned sequentially in a timed relation with a wafer for exposure of it, rather than exposing the whole circuit pattern at once. To this end, a plate member having a slit formed therein is disposed between a light source and an original, and the original is made movable along a direction perpendicular to the lengthwise direction of the slit. Only a slit-like portion of the circuit pattern as illuminated is projected on a wafer and, simultaneously therewith, the original and the wafer are scanningly moved in a timed relation in a direction perpendicular to the lengthwise direction of the slit, such that the circuit pattern as a whole, formed on the original, is printed on the wafer. After this, the stage is moved stepwise by a predetermined distance to move and change the exposure region, and the above-described exposure operation is repeated. This is essentially the same as with the step-and-repeat exposure process.

A large scaled integrated circuit (LSI) as represented by a DRAM, for example, is manufactured generally with processes of a number not less than twenty (20). In these processes, a technique is necessary for overlaying a circuit pattern of a current process upon a circuit pattern formed through a preceding process. An automatic alignment process is a process to this end, for automatically aligning an optical image of an original formed by a reduction optical system with a circuit pattern formed on a wafer.

In the first process, as a circuit pattern is printed on a resist of a wafer, alignment marks to be used for the alignment operation are printed on the wafer together with the circuit pattern, in an outside (finally unnecessary) area of the circuit pattern, which area is called a scribe line. Then, through chemical and heat treatments, a predetermined structure is produced thereat. This is the process to be performed initially. Subsequently, a resist is applied again to this wafer, and the wafer is placed on a wafer stage. Then, while moving the stage, the position of an alignment mark is detected by means of an alignment mark detecting system having a TV camera, for example, and the stage is positioned. The position of the mark is then measured by means of a laser distance measuring device for measuring the position of the wafer stage.

This operation is performed with respect to each alignment mark. The results are then statistically processed, and distortion of the wafer is calculated and the position to which the wafer stage is to be moved is determined. Then, while relying on the amount of movement of the laser distance measuring device, the wafer stage is moved to the thus determined position, for the position for exposure of a next circuit pattern, and then the exposure operation is performed. As described, it is very important for exposure of a wafer to detect the wafer position accurately.

On the other hand, as a displacement detecting system for detecting the amount of movement of a movable member very precisely, there is a displacement detecting system based on the principle of diffraction grating interference. An example is disclosed in Japanese Laid-Open Patent Application, Laid-Open No. 215515/1993, which will be explained below with reference to FIG. 2.

In FIG. 2, a semiconductor laser 211 is disposed at a predetermined distance from a movable member 222 having a diffraction grating 216 is provided on its surface. There are two mirrors 214a and 214b for deflecting coherent light, produced from an active layer of the semiconductor laser 211, toward one point in a space (on the diffraction grating 216), as well as detecting means 215 for receiving diffraction light from the diffraction grating 216. The surface of the active layer 212 is placed substantially in parallel to the surface of the diffraction grating 216, and the light receiving surface of the detecting means 215 is placed substantially in parallel to the surface of the active layer 212. These optical components are disposed so that two laser lights 231a and 231b from the mirrors 214a and 214b intersect with each other within a plane perpendicular to the surface of the active layer 212.

When in the structure described above the active layer 212 of the semiconductor laser 211 is excited, photons are produced and some of them repeatedly go back and forth within the active layer 212. During this process, light amplification occurs and a portion goes through a resonator 213a and emits light as laser light. The laser light is emitted from the opposite sides of the active layer 212, and emitted rays are reflected by the mirrors 214a and 214b toward a single point in space where the diffraction grating 216 is disposed. Since the surface of the active layer 212 is placed parallel to the diffraction grating 216, the occupied space in the direction perpendicular to the plane on which the light is incident is small. Here, the light expands largely in a plane perpendicular to the thickness of the active layer, that is, in a plane parallel to the sheet of the drawing. As a result, the light is not incident on the outside of the diffraction grating 216 but is efficiently incident on the diffraction grating 216 and is diffracted thereby. Consequently, the diffraction light (signal light) increases, which in turn leads to an increase in light impinging on the light receiving means. Thus, the light reception efficiency increases and the signal-to-noise ratio (S/N ratio) increases, such that the detection precision is enhanced.

As the light reflected by the mirror 214a or 214b is projected on the diffraction grating 216, the reflected light impinges on the diffraction grating so that m-th order diffraction light (m is an integer) from the diffraction grating 216, to be detected, is reflected therefrom substantially perpendicularly to the diffraction grating 216. Namely, if the pitch of the diffraction grating 216 is P, the wavelength of the coherent light is $\lambda$, and the incidence angle of the coherent light upon the diffraction grating 216 is $\theta_m$, then the light is projected on the diffraction grating to satisfy the following relation:

$$\theta_m \approx \sin^{-1}(m\lambda/P)$$

Also, two diffraction light beam of positive and negative m-th orders, being substantially perpendicularly projected from the diffraction grating 216, are superposed one upon another and are projected on the light receiving means 215. The detecting means 215 detects the thus interfering lights. More specifically, the detecting means 215 detects the number of brightness/darkness patterns (pulses) of the interference fringe which corresponds to the movement state of the diffraction grating 216. Here, the light receiving surface of the detecting means 215 is placed perpendicularly to the light impinging thereon, to enhance the light reception efficiency.

Higher and higher precision has been required for the alignment between an optical image of an original and a wafer, in consideration of further increases in the density and integration of each semiconductor device. The currently required alignment precision is 0.05 micron, for example. On the other hand, since a laser distance measuring device is based on the wavelength of a laser propagated within an air, there is a problem of instability of a measured value of about 0.03 micron due to any environmental disturbance, such as the fluctuation of air or the non-uniformness of temperature or pressure, for example.

There might be an exposure apparatus having a displacement detecting system such as shown in FIG. 2 for measuring the amount of movement of a stage without using a laser distance measuring device. More specifically, as shown in FIG. 3, a two-dimensional grating scale 1122 comprising an X-axis and Y-axis two-dimensional diffraction grating may be provided on the surface of a wafer chuck 1105 and, also, four heads 1121 each having a semiconductor laser similar to that used in the example of FIG. 2 are mounted on the lower end portion of a barrel 1102, a pair being set in the X direction and another pair being set in the Y direction, so as to detect the amount of displacement of the wafer chuck 1105 along the X-Y plane. In this structure, the distance along which the laser goes through the air becomes shorter. Therefore, with this structure, the effect of any disturbance of the air may be reduced and stable measurement may be assured.

However, if such a displacement detecting system is used in an exposure apparatus, for detecting displacement of a wafer, it will be necessary that in consideration of the movement amount of a wafer or the movement precision thereof, a two-dimensional grating scale has a size of about 150 mm×150 mm (X- and Y-direction lengths) and a diffraction grating pitch of 2 microns both in the X direction and the Y direction. It is practically very difficult to prepare such a large size two-dimensional grating scale. Also, a large size two-dimensional grating will be fragile, and will be difficult to handle.

SUMMARY OF THE INVENTION

It is accordingly an object of the present invention to provide a displacement detecting system capable of detecting the amount of movement along two-dimensional directions correctly, without use of a laser distance measuring device or a two-dimensional diffraction grating.

It is another object of the present invention to provide an exposure apparatus in which, by use of such a displacement detecting system, a wafer can be positioned very precisely.

It is a further object of the present invention to provide a device manufacturing method which uses such an exposure apparatus.

In accordance with an aspect of the present invention, to achieve at least one of these objects, there is provided a displacement detecting system, comprising: a scale provided on a surface of a movable object and having a diffraction grating formed along a predetermined direction; a head unit disposed above the surface of the movable object and having a plurality of detection heads, for detecting displacement of the scale in the predetermined direction, the detection heads being disposed along a direction different from said predetermined direction; and selecting means for selecting at least one detection head out of the detection heads, for detection of a displacement of the scale in the predetermined direction.

In one preferred form of this aspect of the present invention, the width of the diffraction grating in the direction along which the detection heads are disposed, may correspond to the width opposed by at least two detection heads of the detection heads of the head unit.

In this or another preferred form of this aspect of the present invention, each of the detection heads may comprise a light source for providing a coherent light, projecting means for projecting the coherent light from the light source onto the diffraction grating, and detecting means for detecting interference light produced as a result of the interference of diffraction light of predetermined orders having been diffracted by said diffraction grating.

In accordance with another aspect of the present invention, there is provided an exposure apparatus for printing circuit patterns on a wafer sequentially while moving the wafer, the apparatus comprising: a movable stage on which the wafer is to be placed; a scale provided in a portion of a surface of the movable stage, other than a portion on which the wafer is to be placed, the scale having a diffraction grating formed along a predetermined direction; a head unit disposed above the movable stage and having a plurality of detection heads, for detecting displacement of the scale in the predetermined direction, the detection heads being disposed along a direction different from the predetermined direction; and selecting means for selecting at least one detection head out of the detection heads, for detection of a displacement of the scale in the predetermined direction.

In one preferred form of this aspect of the present invention, the width of the diffraction grating in the direction along which the detection heads are disposed, may correspond to the width opposed by at least two detection heads of the detection heads of the head unit.

In this or another preferred form of this aspect of the present invention, each of the detection heads may comprise a light source for providing a coherent light, projecting means for projecting the coherent light from the light source onto the diffraction grating, and detecting means for detecting interference light produced as a result of the interference of diffraction light of predetermined orders having been diffracted by the diffraction grating.

In accordance with a further aspect of the present invention, there is provided a device manufacturing method wherein circuit patterns are printed on a wafer, coated with a photosensitive material, sequentially while moving the wafer, the method comprising the steps of: placing the wafer on a movable stage; and detecting displacement of a scale in a predetermined direction; wherein the scale is formed on the movable stage at a position different from the wafer on the movable stage, and has a diffraction grating formed along the predetermined direction; and wherein the detecting step includes selecting at least one of detection heads of a head unit, disposed above the movable stage, for detecting displacement of the scale in the predetermined direction, the detection heads being disposed along a direction different from the predetermined direction.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 7A and 7B are schematic side views of the displacement sensor of FIG. 6, respectively, wherein FIG. 7A shows it as viewed in the Y direction while FIG. 7B shows it as viewed in the X direction.

DESCRIPTION OF THE PREFERRED EMBODIMENTS

Preferred embodiments of the present invention will be described with reference to the drawings.
[First Embodiment]

Figure 4:
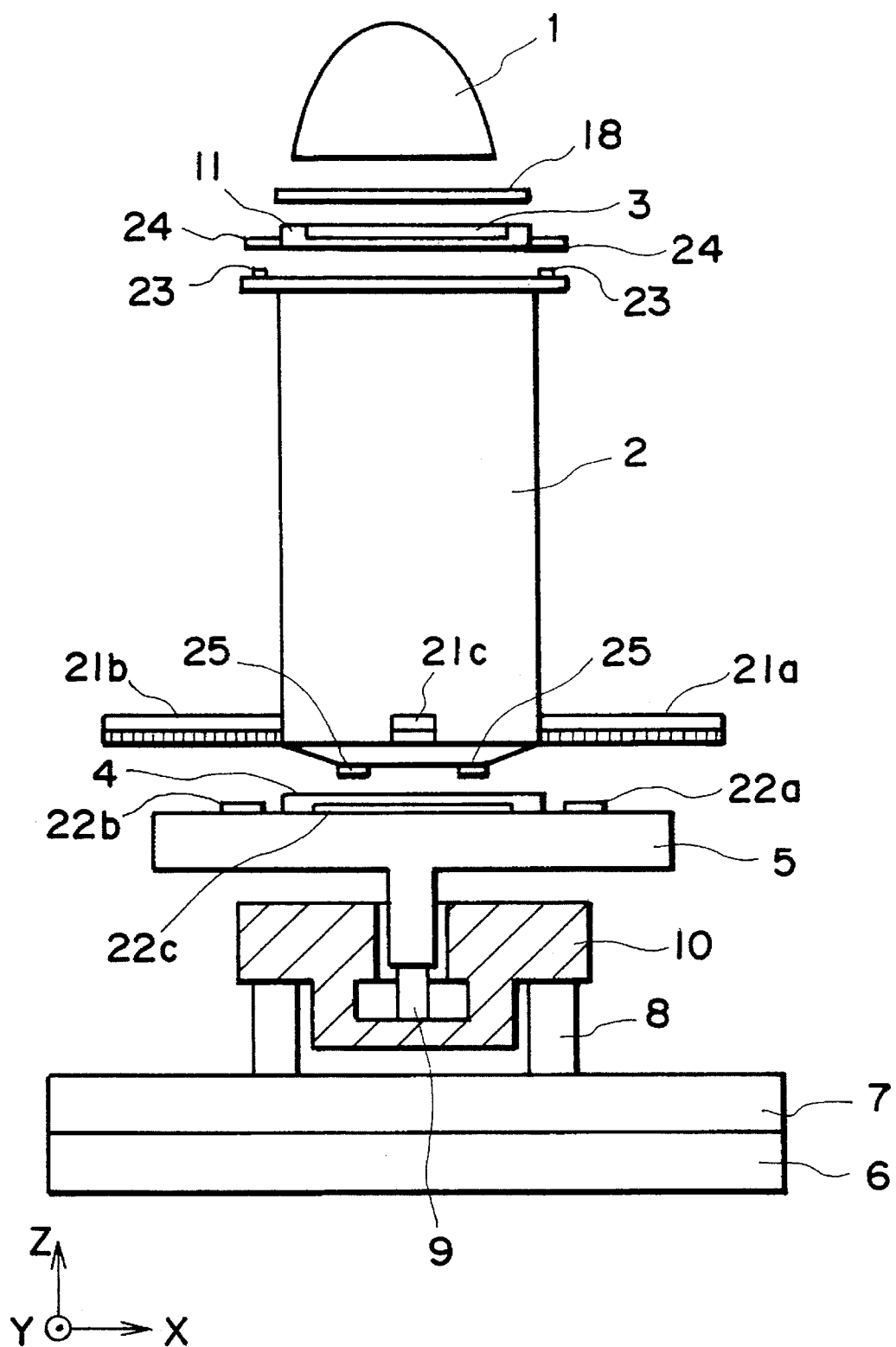
FIG. 4 is a schematic side view of a displacement detecting system according to a first embodiment of the present invention, which is incorporated into an exposure apparatus.
Figure 5:
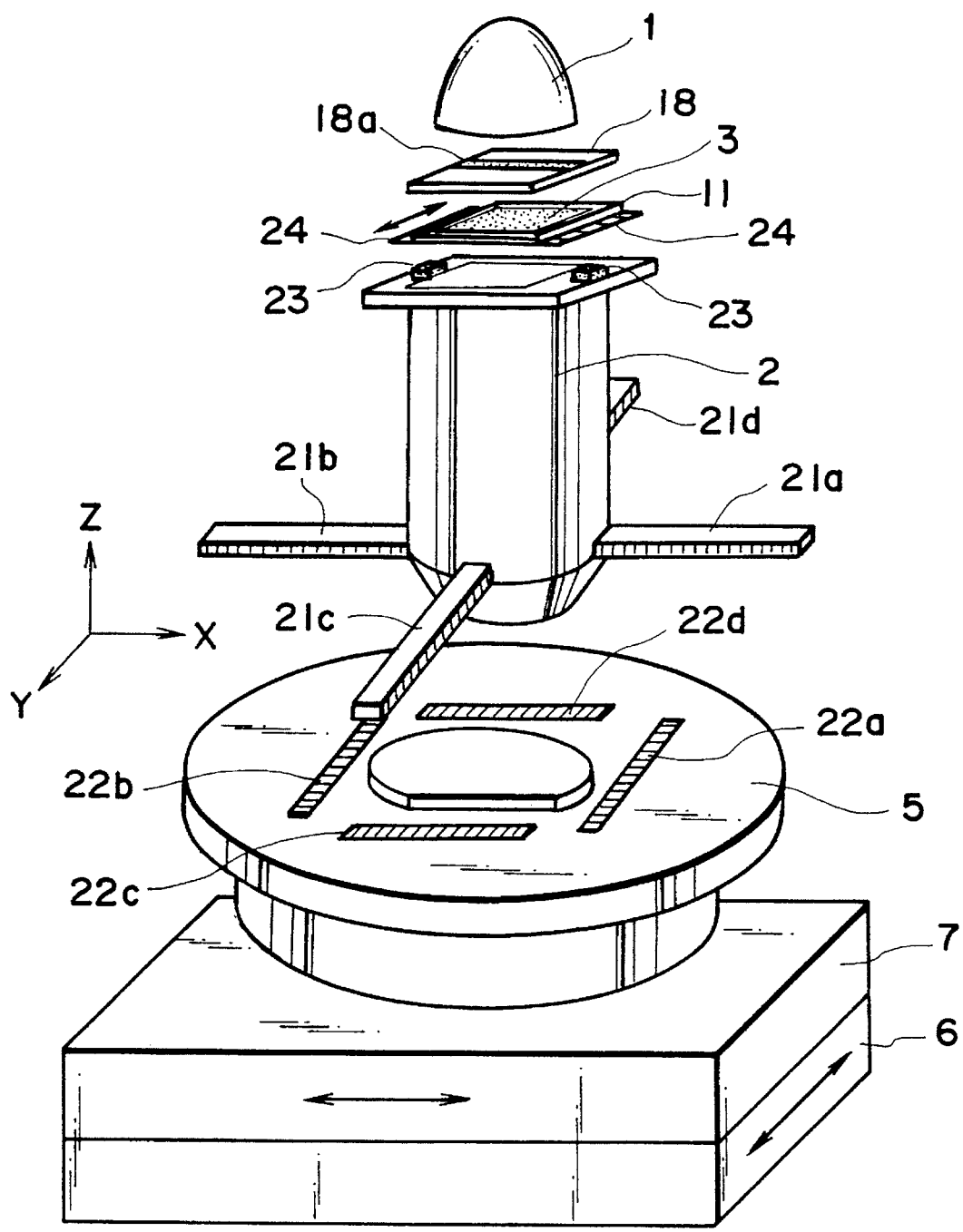
FIG. 5 is a perspective view, schematically showing a main portion of the exposure apparatus of FIG. 4.

FIG. 4 is a schematic side view of a displacement detecting system according to a first embodiment of the present invention, which is incorporated into an exposure apparatus. FIG. 5 is a perspective view, schematically showing a main portion of the exposure apparatus of FIG. 4.

The exposure apparatus of this embodiment is of step-and-scan type, and it comprises a movement mechanism having an X stage 7 movable in the X direction and a Y stage 6 movable in the Y direction. Also, it has a bearing means 10 which is supported by a tilt mechanism 8 for tilt adjustment with respect to the X-Y plane. Wafer chuck 5 for holding a wafer 4 thereon is supported by this bearing means 10 through a fine Z motion mechanism 9 which is expandable and contractible in the Z direction. Thus, the wafer chuck 5 provides a movable member whose position with respect to the X, Y and Z directions as well as its tilting with respect to the X-Y plane are adjustable.

Disposed above the wafer 4 held by the wafer chuck 4 is an original 3 having a circuit pattern formed thereon, which pattern is to be transferred to the wafer 4. The original 3 is held by an original holder 11 which is movable in the Y direction. Disposed above the original 3 is a light source 1. Disposed between the original 3 and the wafer chuck 5 is a barrel (stationary member) 2 including a reduction optical system for projecting an optical image of the circuit pattern of the original 3, as formed by the passage of light from the light source 1 through the original 3, onto the wafer 4 at a reduced scale.

Figure 1:
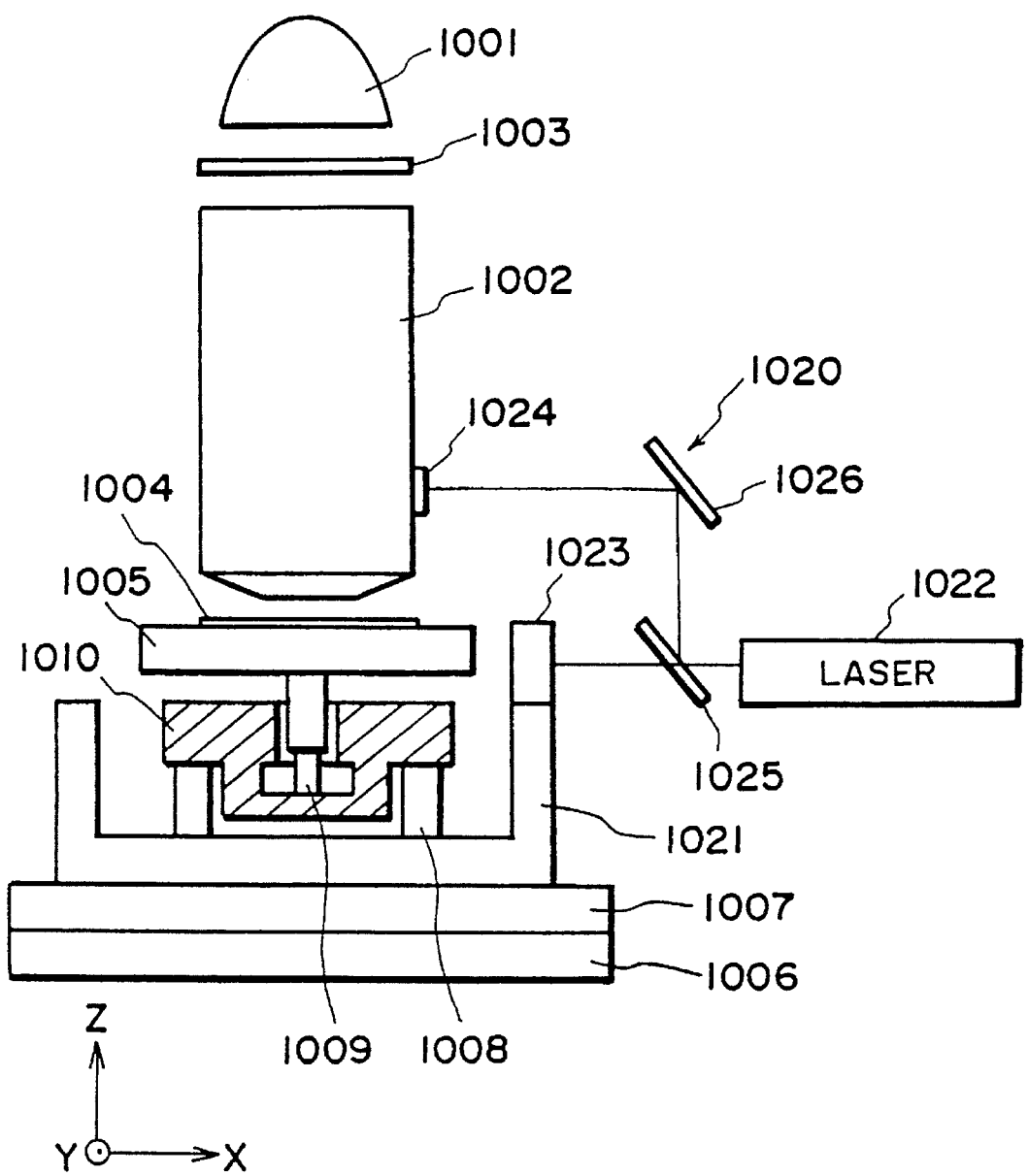
FIG. 1 is a schematic side view of a known type exposure apparatus.
Figure 2:
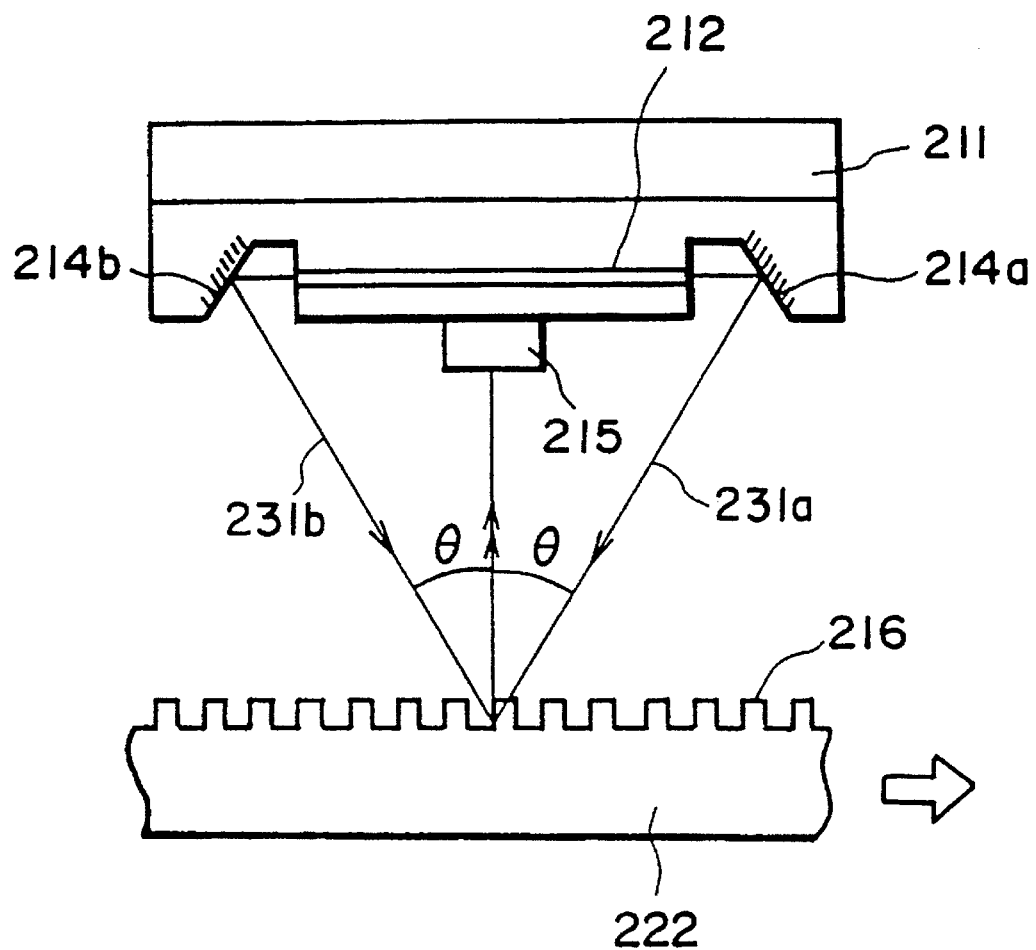
FIG. 2 is a schematic side view of a known type displacement detecting system.
Figure 3:
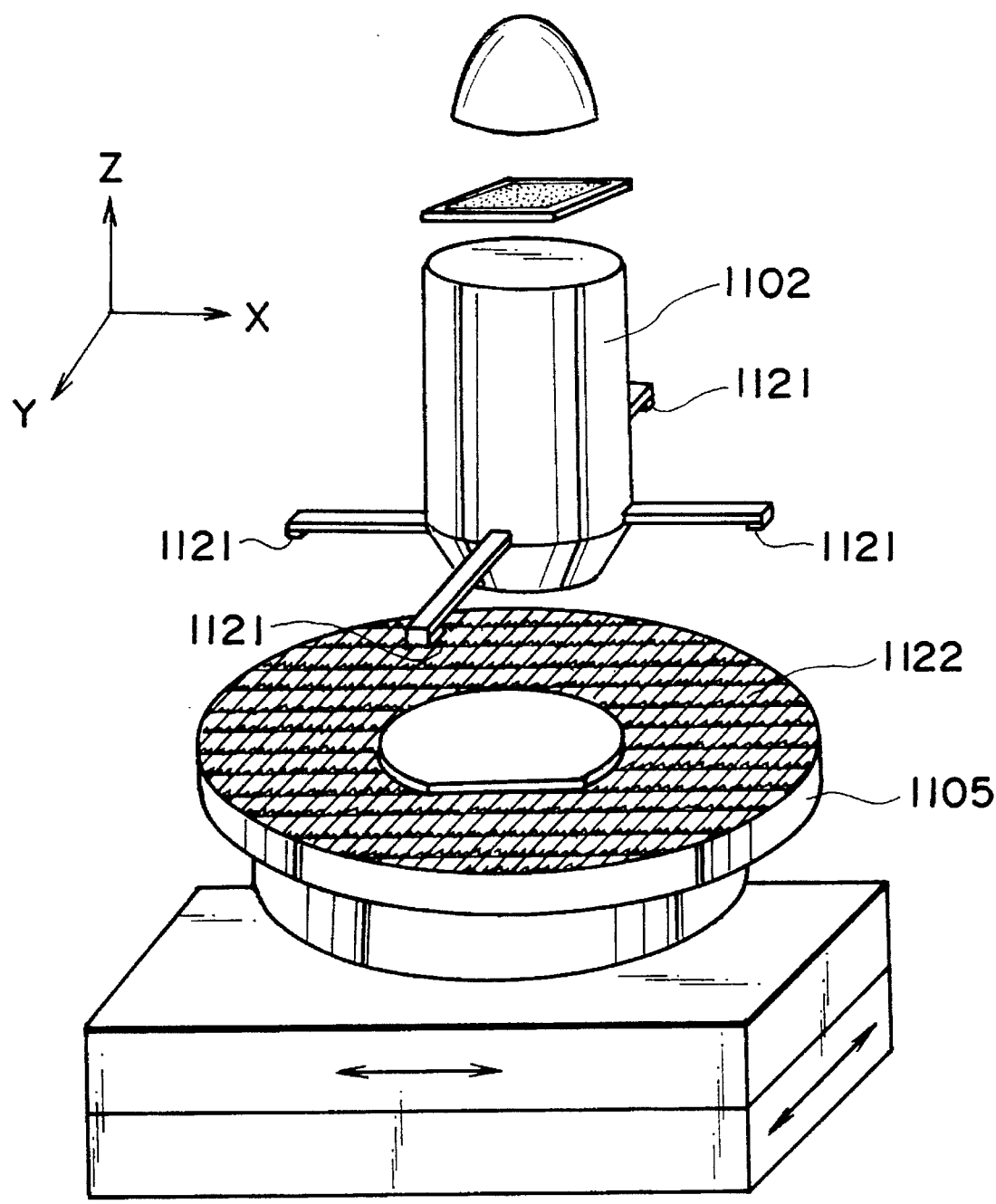
FIG. 3 is a schematic view for explaining a case where the displacement detecting system shown in FIG. 2 is incorporated into the exposure apparatus shown in FIG. 1.

Original scales 24 each having a one-dimensional diffraction grating are fixedly mounted onto the opposite end faces of the original holder 11 which faces are parallel to the Y direction. Also, fixedly mounted at the positions on the top end face of the barrel 2 opposed to the original scales 24, are original heads 23 each for detecting the amount of movement of the original holder 11 relative to the barrel 2 on the basis of the interference of light at the diffraction grating of corresponding one of a the original scales 24. The structure of the original scales 24 and the original heads 23 as well as the principle of displacement detection by them are similar to those of the displacement detecting system of FIG. 2. Therefore, an explanation of them will be omitted here.

Disposed between the light source 1 and the original 3 is a plate member 18 having a slit 18a extending along the X direction.

Mounted on the bottom face of the barrel 2 are four displacement sensors 25. These displacement sensors 25 are operable to measure the distance between the wafer 4 as held by the wafer chuck 5 and the lower end of the barrel 2 in accordance with the principle of triangular measurement to thereby determine the position of the wafer 4 in the Z direction. Here, the details of the displacement sensor 25 will be explained with reference to FIGS. 6 and 7.

Figure 6:
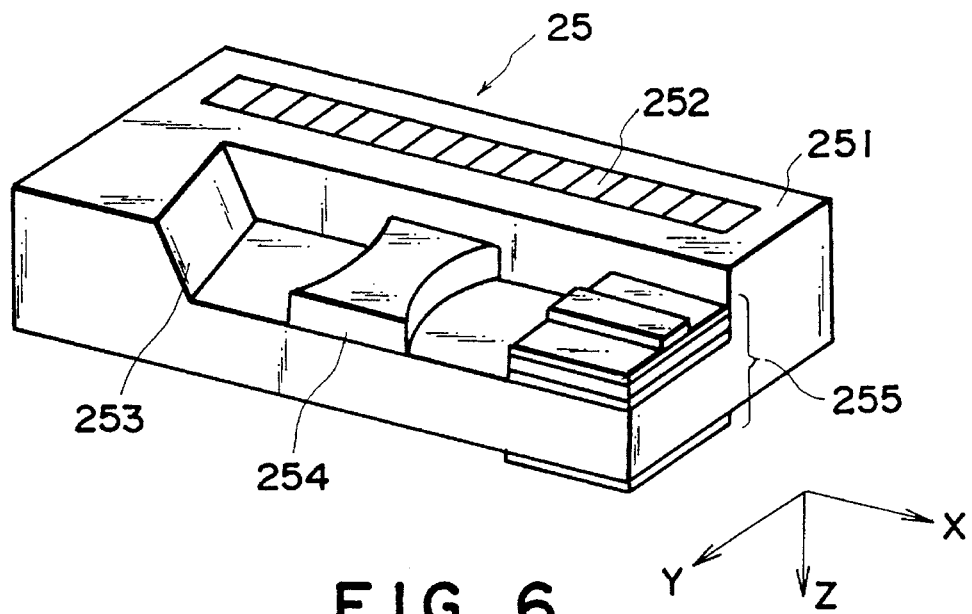
FIG. 6 is a perspective view, schematically showing a displacement sensor of the exposure apparatus of FIG. 4, as viewed from the below.
Figure 7A:
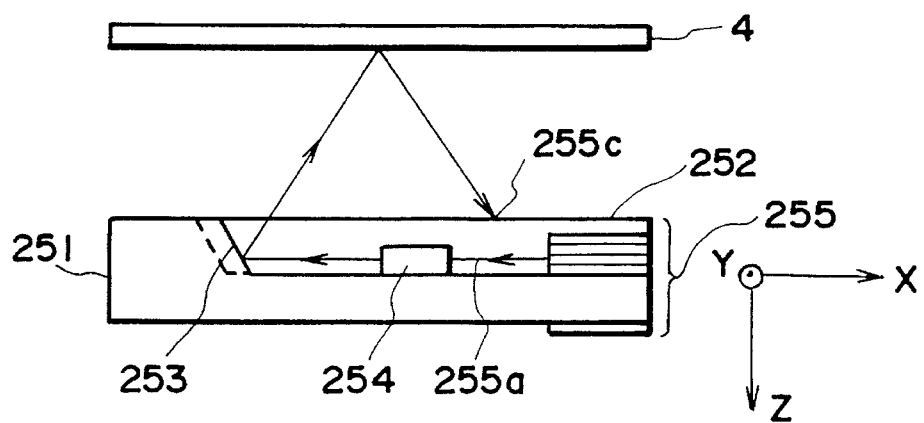
Figure 7B:
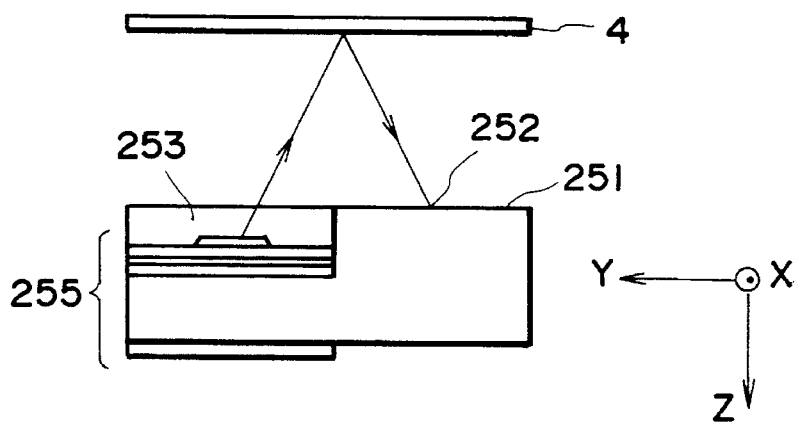

As best seen in FIG. 6, on a base 251 made of silicone, for example, there are a detecting means 252 comprising a CCD line sensor, a light source means 255 comprising a semiconductor laser, an optical member 254 which serves to collect a divergent light beam 255a (see FIG. 7) emitted from the light source means 255, with respect to the Z direction and which also serves to diverge in the same manner in the Y direction so that it provides a linear light beam elongated in the Y direction, and a mirror 253 for reflecting the light from the optical member 254 and for projecting the same obliquely upon the wafer 4 to be measured (see FIG. 7), with a predetermined angle, as a light spot. These components are formed on the base 251 integrally therewith.

In the structure described above, as shown in FIG. 7, the divergent light 255a emitted by the light source means 255 is transformed by the optical member 254 into a linear light beam elongating in the Y direction. This light is reflected by the mirror 253, and the reflected light impinges on the wafer 4. The light is then reflected by the wafer 4, and the reflected light impinges on the detecting means 252. The detecting means 252 serves to detect the light quantity gravity center position of the incident light 255c, and to determine the position coordinates of the incidence position of the light upon the detecting means 252. The optical arrangement is so set that, when the spacing between the wafer 4 and the position sensor 25 is at a predetermined level, the light impinges on a predetermined position upon the detecting means 252. Thus, by detecting the position coordinates of the incidence position of the light upon the detecting means 252, the spacing to the wafer 4 is detected.

Figure 8A:
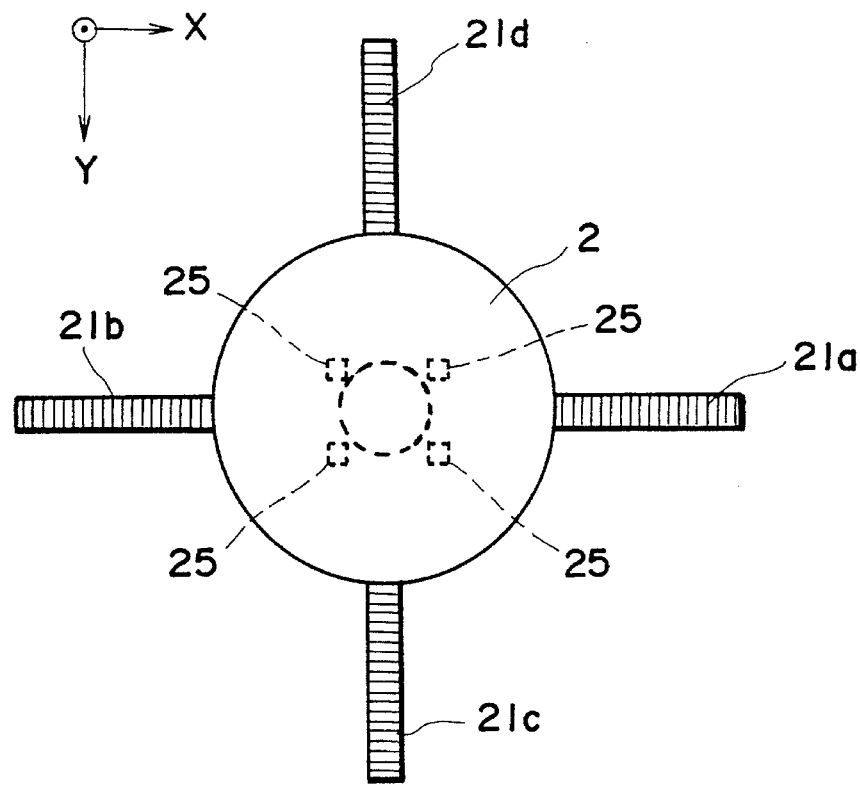
FIGS. 8A and 8B are schematic views, respectively, for explaining the positional relation among wafer head units of the exposure apparatus shown in FIG. 4 and the positional relation among wafer scales of the exposure apparatus.

Referring back to FIGS. 4 and 5, four wafer head units 21a, 21b, 21c and 21d are mounted on the outer circumferential surface at the lower end of the barrel 2. Fixedly mounted on the top face of the wafer chuck 5, around the wafer 4, are corresponding four wafer scales 22a, 22b, 22c and 22d. More specifically, as best seen in FIG. 8A, of the wafer head units 21a, 21b, 21c and 21d, two wafer head units 21a and 21b have their elongating directions parallel to the X direction, and they are disposed diametrically opposed to each other with respect to the central axis of the barrel 2. The remaining two wafer head units 21c and 21d have their elongating directions parallel to the Y direction, and they are disposed diametrically opposed to each other with respect to the central axis of the barrel 2.

Figure 8B:
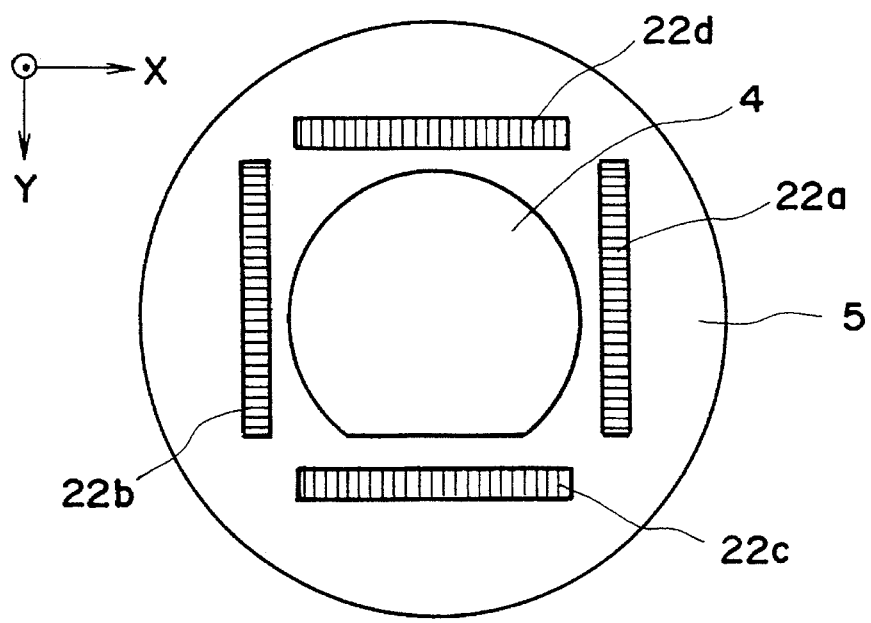

Also, as best seen in FIG. 8B, each of the wafer scales 22a, 22b, 22c and 22d has a size of about 150 mm×150 mm (in length and width), and each wafer scale has a one-dimensional diffraction grating which is defined by forming, on a quartz substrate, short straight nickel chrome patterns of 1-micron widths, arrayed in the scale lengthwise direction at a pitch of 2 microns. Of these wafer scales 22a, 22b, 22c and 22d, two wafer scales 22a and 22b correspond to the wafer head units 21a and 21b having their elongating directions parallel to the X direction, and these wafer scales 22a and 22b are fixed so that their elongating directions are parallel to the Y direction. The other two one-dimensional wafer scales 22c and 22d correspond to the wafer head units 21c and 21d having elongating directions parallel to the Y direction, and these wafer scales 22c and 22d are fixed so that their elongating directions are parallel to the X direction. Also, each wafer scale has its surface placed at substantially the same level as the surface of the wafer or the surface of the wafer chuck with respect to the Z direction.

Details of the wafer head units 21a, 21b, 21c and 21d will be explained, while taking one wafer head unit (21a) as an example.

Figure 9:
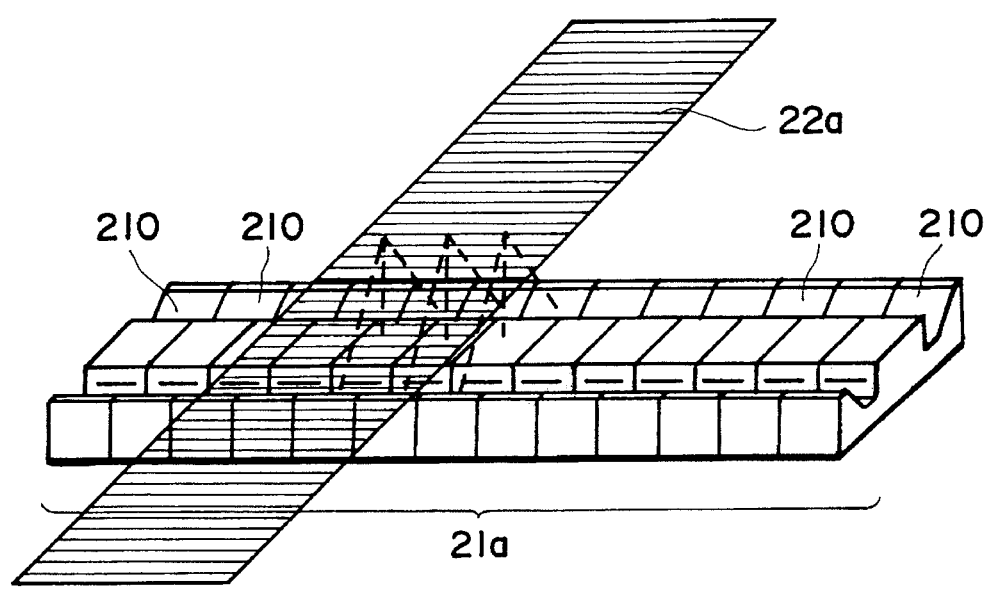
FIG. 9 is a perspective view of a wafer head unit of the exposure apparatus shown in FIG. 4, as viewed from the below.

FIG. 9 is a perspective view of the wafer head unit 21a, as viewed from below. FIG. 9 also depicts the relation of the wafer head unit 21a with the corresponding wafer scale 22a. The wafer head unit 21a comprises, as shown in FIG. 8A or 8B, a number of element heads 210 being juxtaposed and adjoined in the lengthwise direction of the wafer head unit. At least two of the element heads 210 face to the wafer scale 21a, constantly. In other words, the wafer scale 22a has such a width that it is opposed to at least two element heads 210. Each of the element heads 210 has a similar structure as the semiconductor laser having been described with reference to FIG. 2. Also, the principle of displacement detection by using these element heads 210 is similar to that having been described with reference to FIG. 2. Therefore, a description of them will be omitted here.

Two wafer head units 21a and 21b having lengthwise directions parallel to the X direction, serve to detect the amount of movement of the wafer chuck 5 in the Y direction. The other two head units 21c and 21d having lengthwise directions parallel to the Y direction, serve to detect the amount of movement of the wafer chuck 5 in the X direction. It is to be noted that, while in this embodiment these two pairs of wafer head units (and thus the two pairs of wafer scales) are elongated along orthogonal directions (X and Y directions), this is not always necessary. What is necessary is that the two pairs of the wafer head units (or wafer scales) extend along different directions.

Figure 10:
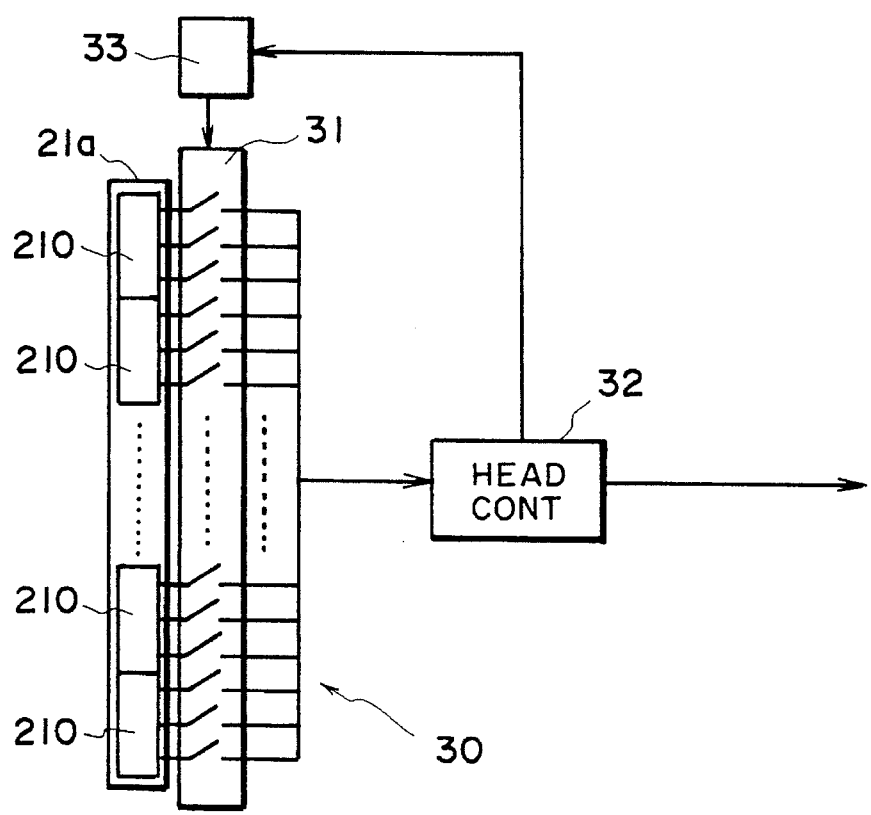
FIG. 10 is a schematic view of a control means for wafer head units of the exposure apparatus shown in FIG. 4.

FIG. 10 illustrates the structure of control means 30 for controlling the wafer head unit 21a. As described hereinbefore, the wafer head unit 21a comprises a plurality of element heads 210, and the outputs of these element heads 210 are applied through an array relay switch 31 to a head controller 32. The head controller 32 serves to discriminate one or those of the element heads 210 which is or are operable to perform the detection, on the basis of the light quantity of the reflected light, of the light directed to the one-dimensional diffraction grating of the wafer scale 22a (see FIG. 8A or 8B). Here, the head controller 210 signals a relay switch controller 33 so as to fetch outputs of at least two element heads 210 simultaneously. In response to the signal from the head controller 32, the relay switch controller 33 operates to connect the relays for at least two of the element heads 210 which are to be made active, and supplies to the head controller 32 a dual phase interference signal, which includes the direction.

It will be understood from the foregoing description that the displacement detecting system of this embodiment of the present invention is provided by the wafer head units 21a, 21b, 21c and 21d, the wafer scales 22a, 22b, 22c and 22d, and the control means 30.

Next, the operation of the exposure apparatus of according to this embodiment will be explained.

First, a wafer 4 coated with a resist is placed and fixed onto the wafer chuck 5, and by using the displacement sensors 25 the position of the wafer 4 in the Z direction is detected. Here, the position or tilt of the wafer 4 deviates from a predetermined position, and the tilt mechanism 8 and/or the fine Z motion mechanism 9 is used to adjust the position of the wafer chuck 5, toward the predetermined position.

Subsequently, a circuit pattern of an original 3 is projected onto the wafer 4 at a reduced scale, so as to print the circuit pattern on the wafer. Here, the light from the light source 3 is projected onto the original 3 through the slit 18a and, therefore, a portion of the circuit pattern of the original 3 is projected, in a slit-like form, onto the wafer. Simultaneously with this exposure of the wafer 4, the original 3 and the wafer 4 are moved in a timed relation with a speed difference corresponding to the reduction magnification of the reduction optical system of the barrel 2, by which the whole of one original 3 is printed on the wafer 4, in a region corresponding to one chip. Thereafter, the X stage 7 and the Y stage 8 are moved stepwise through a predetermined distance to shift the exposure region on the wafer 4, and the above-described exposure operation is repeated. This is essentially the same as that of the step-and-repeat exposure process.

The movement of the original 3 is performed by moving the original holder 11 while detecting diffraction light from the diffraction grating of the original scale 24 by use of the original head 23. As regards the scan of the wafer 4, although details will be explained later, the principle thereof is basically the same as the scan of the original 3.

Figure 11:
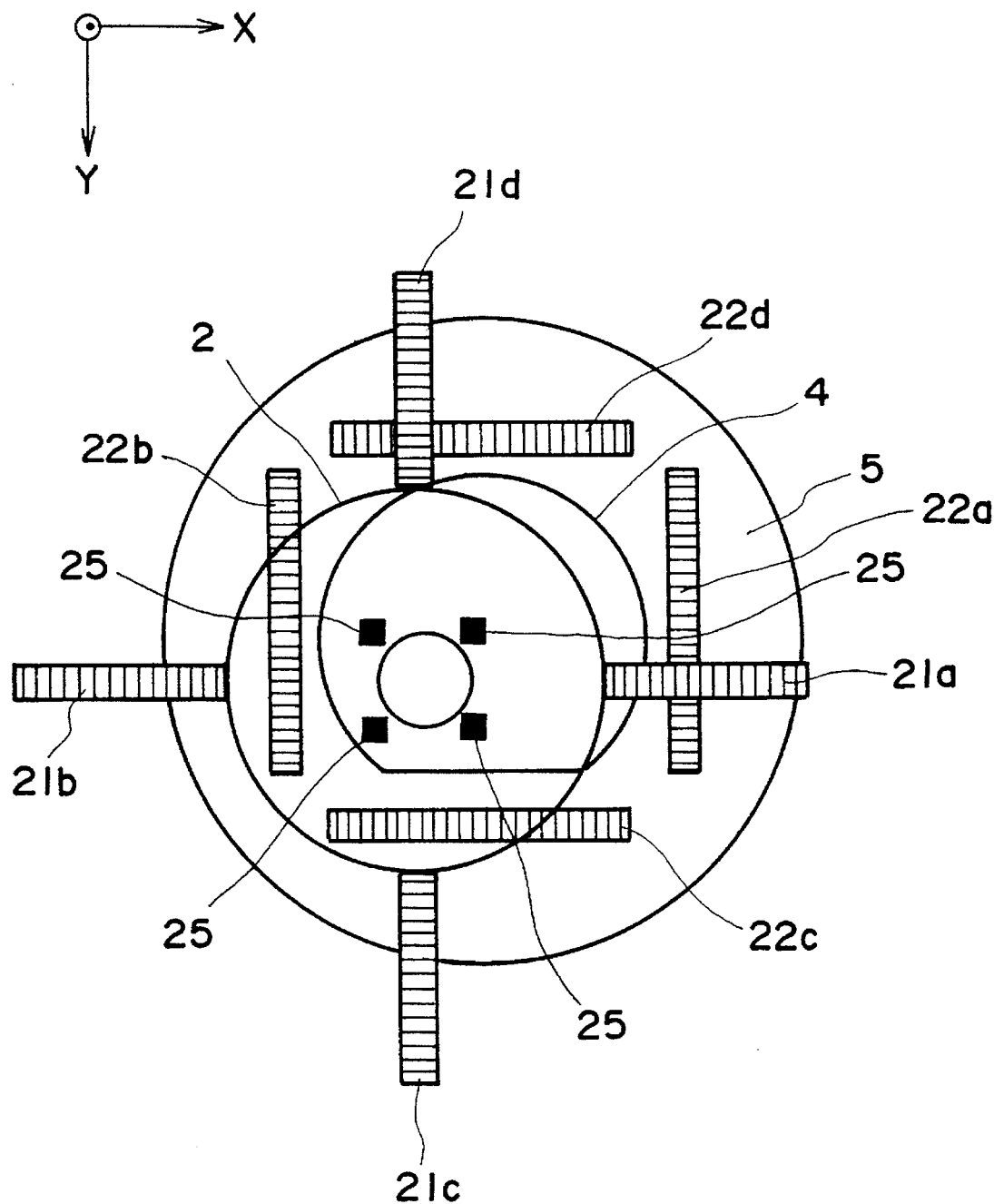
FIG. 11 is a perspective view, for explaining the positional relation among wafer head units and wafer scales during an exposure operation in the exposure apparatus of FIG. 4.

FIG. 11 is a perspective view for explaining the positional relationship between the wafer head units and the wafer scales during the exposure operation of the exposure apparatus shown in FIG. 4.

In FIG. 11, as the wafer chuck 5 moves in the negative Y direction, the wafer scales 22a, 22b, 22c and 22d also move in the negative Y direction. Here, of the wafer head units 21a, 21b, 21c and 22d, those (head units 21a and 21d) which are overlying associated wafer scales operate to read the amount of movement of these wafer scales 22a and 21d. Here, the element heads of one wafer head unit 21a operate to detect the amount of movement of the wafer scale 22a along the Y direction. As regards the other wafer head unit 21d, since the wafer scale 22d moves along the Y direction, it operates so that, when one element head and an adjacent element head provides detected values at the same time, the detected values with respect to the X direction are held while connecting the detected values sequentially, to prevent getting off the scale and to avoid the resultant discontinuity of detected values.

As the wafer chuck moves further in the negative Y direction, the wafer head units 21b and 21c overlie the wafer scales 22c and 22d, while on the other hand the wafer head units 21a and 21b go out of overlying the wafer scales 22a and 22d. Thus, when the detected value of the wafer head unit 21c and the detected value of the wafer head unit 21c (having operated hitherto) take simultaneous values, these detected values are connected, such that a wide detection stroke of the stage is assured.

The amount of movement of the wafer chuck in the X and/or Y direction is detected on the basis of the principle of diffraction grating interference, as described hereinbefore. Therefore, instability of a detected value due to any environmental change as in the case where a laser distance measuring device is used for the detection, is avoided. Thus, the position of the wafer chuck 5 is detected with good precision. Also, since a used diffraction grating is a one-dimensional diffraction grating, the manufacture of the same and the handling of the same are quite easy.

While the foregoing description has been made with reference to a step-and-scan type exposure apparatus, the invention is applicable also to a step-and-repeat type exposure apparatus: in such case the plate member 18, the original head 23 and the original scale 24 are not provided, and the original 3 is held fixed such that the circuit pattern of the original 3 is printed at once.

[Second Embodiment]

Figure 12:
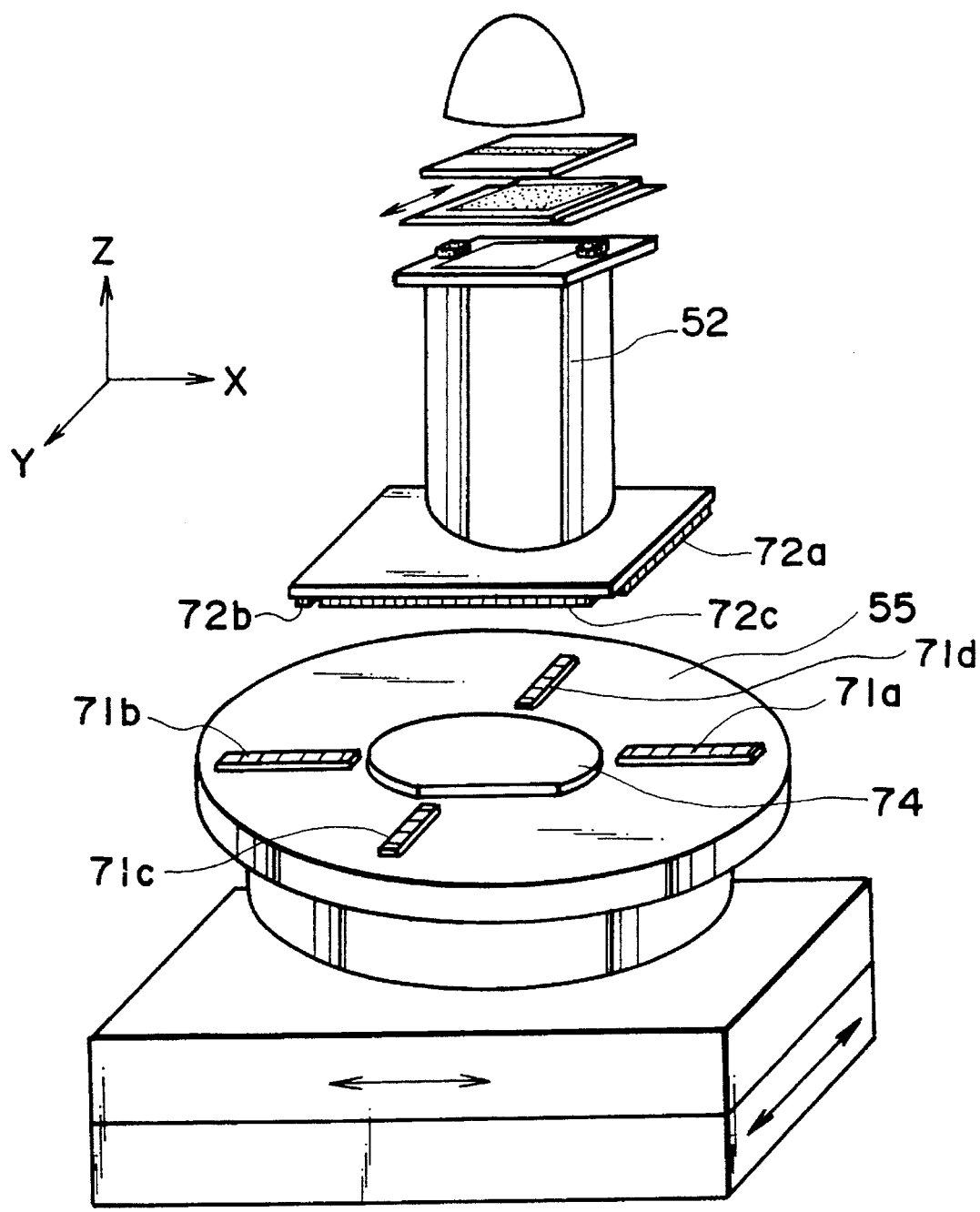
FIG. 12 is a schematic view of a displacement detecting system according to a second embodiment of the present invention, which is incorporated into an exposure apparatus.
Figure 13A:
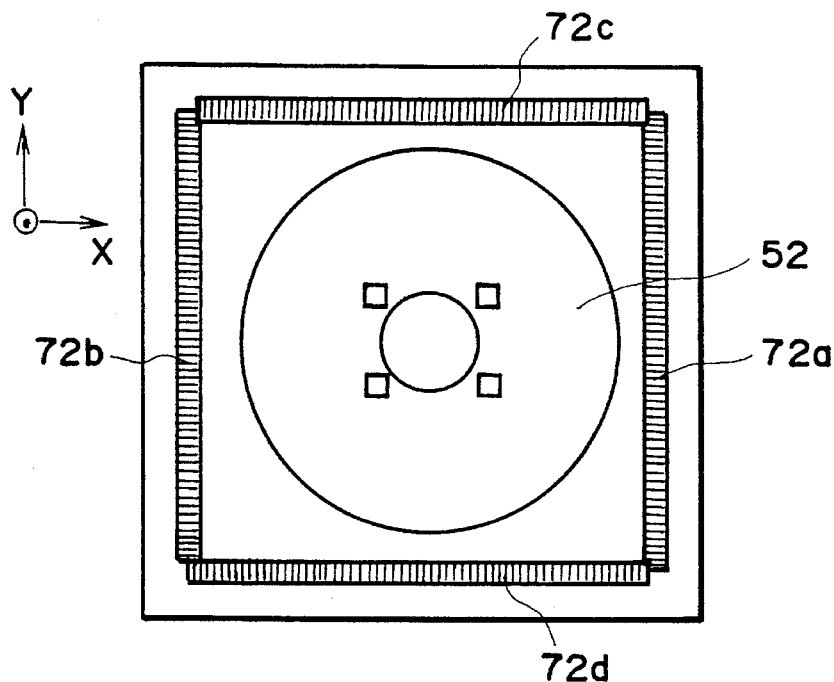
FIGS. 13A and 13B are schematic views, respectively, for explaining the positional relation among the wafer scales of the exposure apparatus of FIG. 12 and the positional relation among the wafer head units of the exposure apparatus, respectively, wherein in FIG. 13A is a view of barrel from the below and in FIG. 13B is a view of a wafer chuck from the above.
Figure 13B:
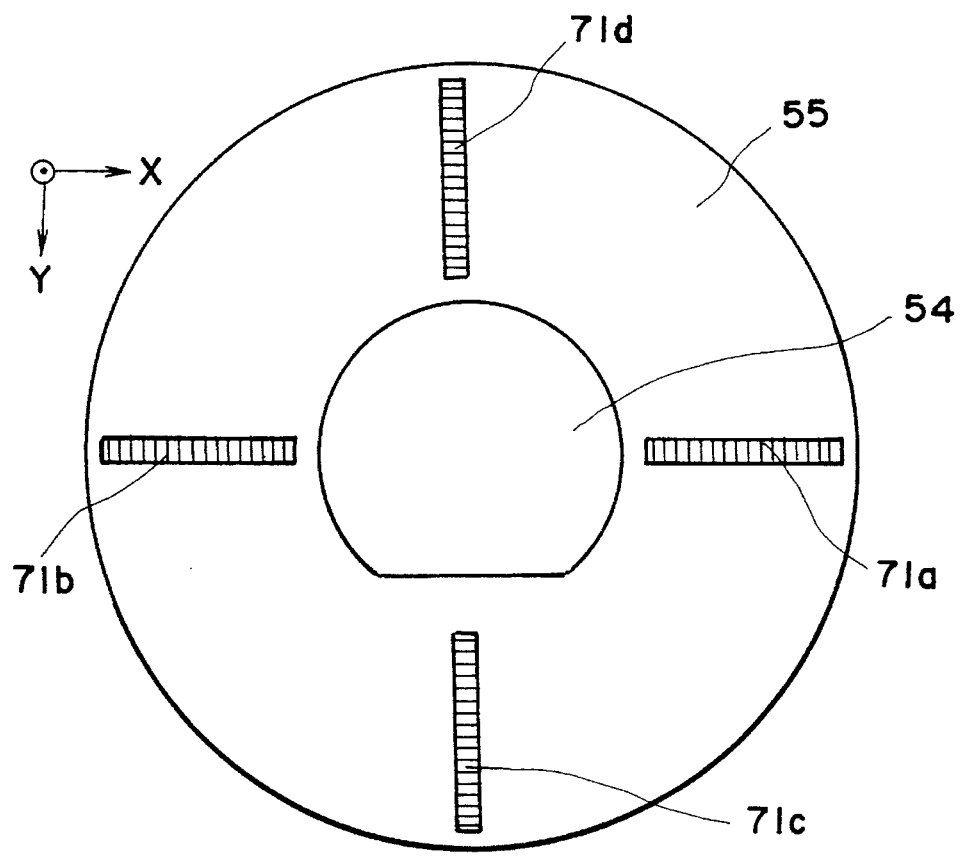

FIG. 12 is a schematic perspective view of a second embodiment, wherein a displacement detecting system of the present invention is incorporated into an exposure apparatus. FIG. 13 is a schematic view for explaining the positional relation among wafer scales of the exposure apparatus of FIG. 12 as well as the positional relation among wafer head units of the exposure apparatus.

In this embodiment, a plate member is fixedly attached to the lower end portion of a barrel 52, and four wafer scales 72a, 72b, 72c and 72d are fixedly mounted on this plate member. Also, fixedly mounted on the top surface of a wafer chuck 55, around a wafer 54, are four wafer head units 71a, 71b, 71c and 71d. The structure and disposition of these wafer scales 72a, 72b, 72c and 72d and of these wafer head units 71a, 71b, 71c and 71d are similar to those of the first embodiment. Further, the structure of the remaining portion of the exposure apparatus is similar to that of the first embodiment. Therefore, a description of them will be omitted here.

In this embodiment as described above, the wafer head units 71a, 71b, 71c and 71d are provided on the wafer chuck 55. On the other hand, the wafer scales 72a, 72b, 72c and 72d which are light as compared with the wafer head units 71a, 71b, 71c and 71d, are provided on the barrel 52. This allows simplification of the holding mechanism to the barrel 52, and it enables stable detection.

Next, an embodiment of device manufacturing method which uses any one of the exposure apparatuses described hereinbefore, will be explained.

Figure 14:
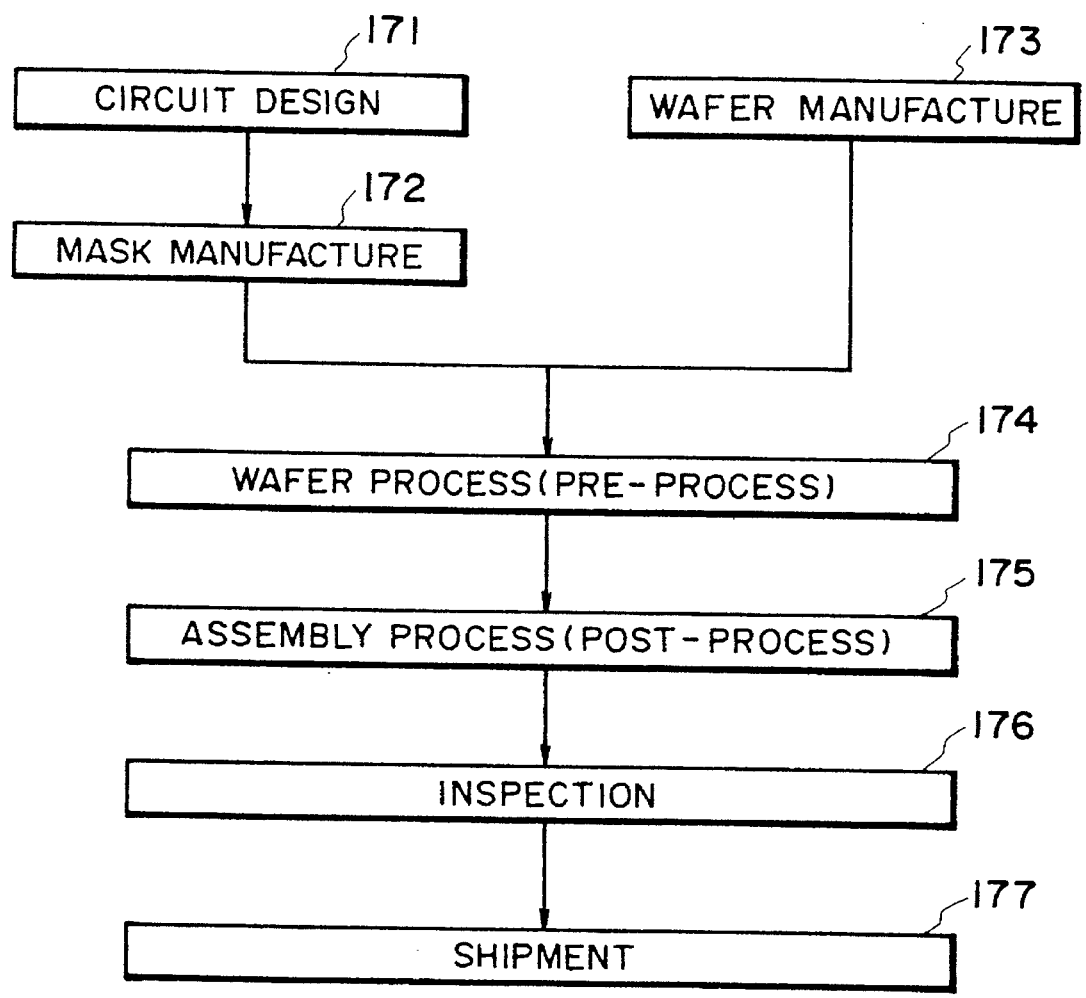
FIG. 14 is a flow chart of device manufacturing processes.

FIG. 14 is a flow chart of the sequence of manufacturing a semiconductor device such as a semiconductor chip (e.g. IC or LSI), a liquid crystal panel or a CCD, for example. Step 171 is a design process for designing the circuit of a semiconductor device. Step 172 is a process for manufacturing a mask on the basis of the circuit pattern design. Step 173 is a process for manufacturing a wafer by using a material such as silicon.

Step 174 is a wafer process which is called a pre-process wherein, by using the so prepared mask and wafer, circuits are practically formed on the wafer through lithography. Step 175 subsequent to this is an assembling step which is called a post-process wherein the wafer processed by step 174 is formed into semiconductor chips. This step includes assembling (dicing and bonding) and packaging (chip sealing). Step 176 is an inspection step wherein an operability check, a durability check and so on of the semiconductor devices produced by step 175 are carried out. With these processes, semiconductor devices are finished and they are shipped (step 177).

Figure 15:
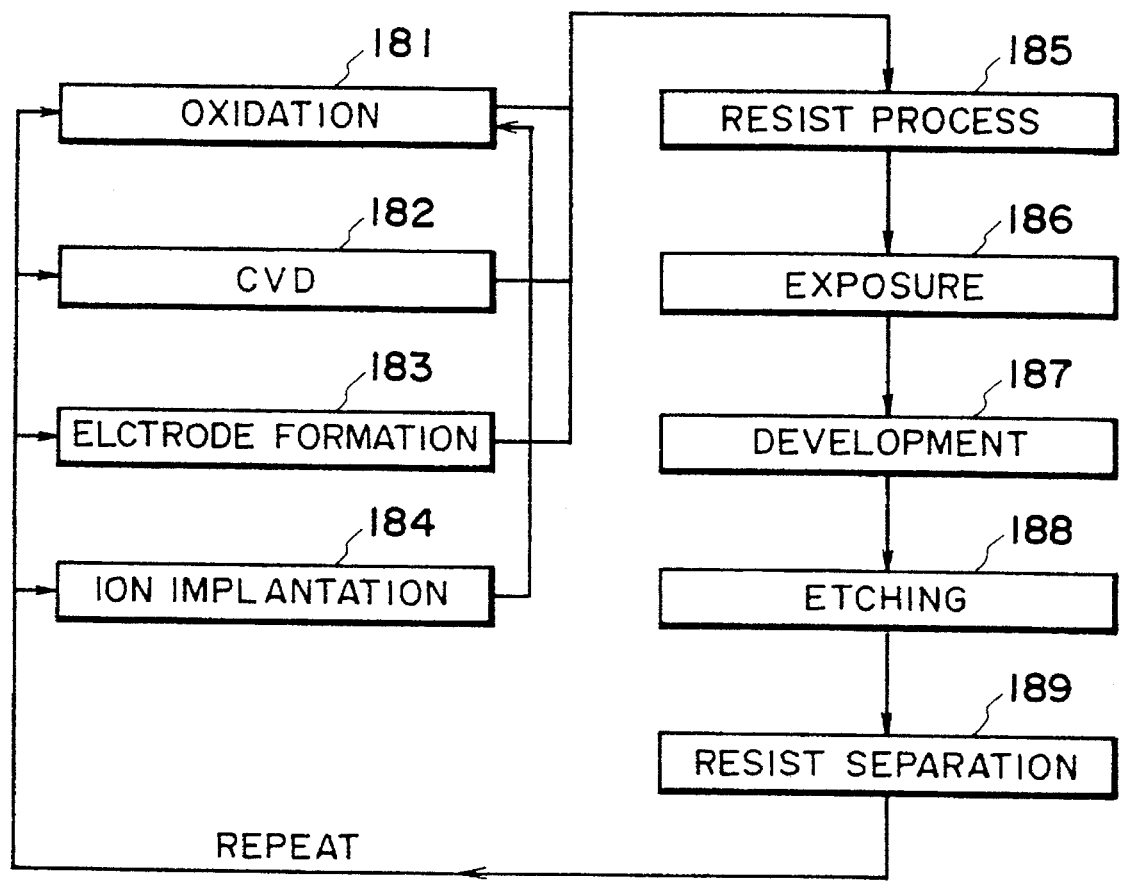
FIG. 15 is a flow chart for explaining details of a wafer process of the processes shown in FIG. 15.

FIG. 15 is a flow chart showing details of the wafer process. Step 181 is an oxidation process for oxidizing the surface of a wafer. Step 182 is a CVD process for forming an insulating film on the wafer surface. Step 183 is an electrode forming process for forming electrodes on the wafer by vapor deposition. Step 184 is an ion implanting process for implanting ions to the wafer. Step 185 is a resist process for applying a resist (photosensitive material) to the wafer. Step 186 is an exposure process for printing, by exposure, the circuit pattern of the mask on the wafer through the exposure apparatus described above. Step 187 is a developing process for developing the exposed wafer. Step 188 is an etching process for removing portions other than the developed resist image. Step 189 is a resist separation process for separating the resist material remaining on the wafer after being subjected to the etching process. By repeating these processes, circuit patterns are superposedly formed on the wafer.

The foregoing description has been made to embodiments wherein a displacement detecting system is incorporated into an exposure apparatus. However, the invention is not limited to this, but it is applicable also to a movable stage in a mechanical working machine such as a high precision milling machine, a lathing machine or an electron beam working machine, for example.

While the invention has been described with reference to the structures disclosed herein, it is not confined to the details set forth and this application is intended to cover such modifications or changes as may come within the purposes of the improvements or the scope of the following claims.

What is claimed is:

1. A displacement detecting system, comprising:

a scale provided on a surface of a movable object and having a diffraction grating formed along a predetermined direction;

a head unit disposed above the surface of the movable object and having a plurality of detection heads, for detecting displacement of said scale in said predetermined direction, said detection heads being disposed along a direction different from said predetermined direction; and selecting means for selecting at least one detection head out of said detection heads, for detection of a displacement of said scale in said predetermined direction.

2. A system according to claim 1, wherein the width of said diffraction grating in the direction along which said detection heads are disposed, is sufficiently wide so that at least two detection heads of said detection heads of said head unit directly face said diffraction grating.

3. A system according to claim 1, wherein each of said detection heads comprises a light source for providing coherent light, projecting means for projecting the coherent light from said light source onto said diffraction grating, and detecting means for detecting interference light produced as a result of interference of diffraction light of predetermined orders having been diffracted by said diffraction grating.

4. An exposure apparatus for printing circuit patterns on a wafer sequentially while moving the wafer, said apparatus comprising:

a movable stage on which the wafer is to be placed;

a scale provided in a portion of a surface of said movable stage, other than a portion on which the wafer is to be placed, said scale having a diffraction grating formed along a predetermined direction;

a head unit disposed above said movable stage and having a plurality of detection heads, for detecting displacement of said scale in said predetermined direction, said detection heads being disposed along a direction different from said predetermined direction; and selecting means for selecting at least one detection head out of said detection heads, for detection of a displacement of said scale in said predetermined direction.

5. An apparatus according to claim 4, wherein the width of said diffraction grating in the direction along which said detection heads are disposed, is sufficiently wide so that at least two detection heads of said detection heads of said heat unit directly face said diffraction grating.

6. An apparatus according to claim 4, wherein each of said detection heads comprises a light source for providing coherent light, projecting means for projecting the coherent light from said light source onto said diffraction grating, and detecting means for detecting interference light produced as a result of interference of diffraction light of predetermined orders having been diffracted by said diffraction grating.

7. A device manufacturing method wherein circuit patterns are printed on a wafer, coated with a photosensitive material, sequentially while moving the wafer, said method comprising the steps of:

placing the wafer on a movable stage; and detecting displacement of a scale in a predetermined direction;

wherein the scale is formed on the movable stage at a position different from the wafer on the movable stage, and has a diffraction grating formed along the predetermined direction; and wherein said detecting step includes selecting at least one of detection heads of a head unit, disposed above the movable stage, for detecting displacement of the scale in the predetermined direction, the detection heads being disposed along a direction different from the predetermined direction.

* * * * *

UNITED STATES PATENT AND TRADEMARK OFFICE
CERTIFICATE OF CORRECTION

PATENT NO. : 5,610,715
DATED : March 11, 1997
INVENTOR(S) : MINORU YOSHII, ET AL.

It is certified that error appears in the above-identified patent and that said Letters Patent is hereby corrected as shown below:

ON THE COVER PAGE

AT [54] TITLE

"EXPOSE" should read --EXPOSURE--.

COLUMN 1

Line 2, "EXPOSE" should read --EXPOSURE--.
    Line 13, "aspect;" should read --aspect,--.
    Line 25, "as" should be deleted.

COLUMN 3

Line 18, "is" should be deleted.
    Line 67, $\theta_m \approx \sin^{-1}(m\lambda/P)$" should read --$\theta_m \doteqdot \sin^{-1}(m\lambda/P)$--.

COLUMN 5

Line 7, "said" should read --the--.
    Line 23, "said" should read --the--.

COLUMN 6

Line 49, "of" should read --of a--.

UNITED STATES PATENT AND TRADEMARK OFFICE
CERTIFICATE OF CORRECTION

PATENT NO. : 5,610,715
DATED : March 11, 1997
INVENTOR(S) : MINORU YOSHII, ET AL.

It is certified that error appears in the above-indentified patent and that said Letters Patent is hereby corrected as shown below:

COLUMN 7

Line 31, "grating of" should read --grating of a--.
Line 32, "a" should be deleted.
Line 65, "elongating" should read --elongated--.

COLUMN 10

Line 16, "overlie" should read --then overlie--.

Signed and Sealed this

Seventh Day of October, 1997

Attest:

BRUCE LEHMAN

Attesting Officer

Commissioner of Patents and Trademarks